US009158063B2

(12) United States Patent
Curtis

(10) Patent No.: US 9,158,063 B2
(45) Date of Patent: Oct. 13, 2015

(54) APPARATUS FOR DESPECKLING LASER SYSTEMS AND METHODS THEREOF

(75) Inventor: Kevin Curtis, Longmont, CO (US)

(73) Assignee: RealD Inc., Beverly Hills, CA (US)

( * ) Notice: Subject to any disclaimer, the term of this patent is extended or adjusted under 35 U.S.C. 154(b) by 398 days.

(21) Appl. No.: 13/544,959

(22) Filed: Jul. 9, 2012

(65) Prior Publication Data

US 2013/0010265 A1 Jan. 10, 2013

Related U.S. Application Data

(60) Provisional application No. 61/505,217, filed on Jul. 7, 2011, provisional application No. 61/505,220, filed on Jul. 7, 2011, provisional application No. 61/505,211, filed on Jul. 7, 2011, provisional application No. 61/505,455, filed on Jul. 7, 2011.

(51) Int. Cl.
G02B 27/48 (2006.01)
G02B 6/02 (2006.01)
G02B 6/42 (2006.01)
G03B 21/20 (2006.01)
G02B 6/028 (2006.01)
H01S 5/022 (2006.01)
H01S 5/40 (2006.01)
G03B 33/06 (2006.01)

(52) U.S. Cl.
CPC *G02B 6/02* (2013.01); *G02B 6/421* (2013.01); *G02B 27/48* (2013.01); *G03B 21/208* (2013.01); *G03B 21/2013* (2013.01); *G03B 21/2033* (2013.01); *G02B 6/028* (2013.01); *G02B 6/0281* (2013.01); *G02B 6/0283* (2013.01); *G02B 6/0285* (2013.01); *G02B 6/0286* (2013.01); *G02B 6/0288* (2013.01); *G03B 33/06* (2013.01); *H01S 5/02284* (2013.01); *H01S 5/4012* (2013.01)

(58) Field of Classification Search
CPC ........... G02B 27/0933; G02B 27/0927; G02B 27/48; G02B 6/028; G02B 6/0283; G02B 6/0285; G02B 6/0286; G02B 6/0288; G03B 21/2046; G03B 21/208; H04N 9/3161; H04N 9/3129; H04N 9/3132; H04N 9/3135
USPC ............................. 353/77, 78, 94, 98, 99, 122
See application file for complete search history.

(56) References Cited

U.S. PATENT DOCUMENTS 3,588,217 A * 6/1971 Mathisen ........................ 59/32
4,011,403 A * 3/1977 Epstein et al. ................ 348/370
(Continued)

OTHER PUBLICATIONS

Kishore V. Chellappan et al., "Laser-based displays: a review," Applied Optics, vol. 49, No. 25, pp. F79-F98 (2010).
(Continued)

*Primary Examiner* — Bao-Luan Le
(74) *Attorney, Agent, or Firm* — Darlene K. Kondo; Neil G. J. Mothew

(57) ABSTRACT

Illuminating coherent or partially coherent light may be directed over an optical fiber and may be despeckled by vibrating the optical fiber or by increasing the number of modes and modal dispersion. An exemplary embodiment is directed to an optical fiber attached to a vibrating device operable to vibrate the optical fiber above a threshold frequency. Another exemplary embodiment is directed to an optical fiber configured to have a refractive index profile operable to increase the number of modes and modal dispersion.

19 Claims, 4 Drawing Sheets

(56) References Cited

U.S. PATENT DOCUMENTS

| | | | |
|---|---|---|---|
| 4,035,068 | A | 7/1977 | Rawson |
| 4,155,630 | A | 5/1979 | Ih |
| 4,360,372 | A | 11/1982 | Maciejko |
| 5,272,473 | A | 12/1993 | Thompson |
| 5,313,479 | A | 5/1994 | Florence |
| 5,727,098 | A * | 3/1998 | Jacobson ............... 385/31 |
| 6,122,023 | A | 9/2000 | Chen |
| 6,445,487 | B1 | 9/2002 | Roddy |
| 6,577,429 | B1 * | 6/2003 | Kurtz et al. ............... 359/279 |
| 6,594,090 | B2 * | 7/2003 | Kruschwitz et al. ........ 359/707 |
| 6,791,739 | B2 * | 9/2004 | Ramanujan et al. ........ 359/279 |
| 6,844,970 | B2 | 1/2005 | Olczak |
| 6,895,149 | B1 | 5/2005 | Jacob |
| 6,975,294 | B2 | 12/2005 | Manni |
| 7,113,657 | B2 * | 9/2006 | Park ............... 385/3 |
| 7,199,933 | B2 | 4/2007 | Yavid |
| 7,244,028 | B2 | 7/2007 | Govorkov |
| 7,342,719 | B1 | 3/2008 | Kalmanash |
| 7,379,651 | B2 | 5/2008 | Abu-Ageel |
| 7,457,330 | B2 * | 11/2008 | Luo et al. ............... 372/22 |
| 7,489,714 | B2 | 2/2009 | Park |
| 7,527,384 | B2 | 5/2009 | Kim |
| 7,585,078 | B2 | 9/2009 | Kim |
| 7,620,091 | B2 | 11/2009 | Heusler |
| 7,649,610 | B1 * | 1/2010 | Dultz et al. ............... 349/193 |
| 7,719,738 | B2 | 5/2010 | Abu-Ageel |
| 7,724,413 | B2 * | 5/2010 | Koyata et al. ............... 359/238 |
| RE42,251 | E | 3/2011 | Plut |
| 7,922,333 | B2 | 4/2011 | Akahane |
| 7,969,644 | B2 * | 6/2011 | Tilleman et al. ............... 359/298 |
| 8,226,247 | B2 * | 7/2012 | Kitano et al. ............... 353/99 |
| 8,786,857 | B2 * | 7/2014 | Masterson et al. ............... 356/437 |
| 2003/0030880 | A1 * | 2/2003 | Ramanujan et al. ........ 359/245 |
| 2003/0039036 | A1 * | 2/2003 | Kruschwitz et al. ........ 359/707 |
| 2004/0247222 | A1 * | 12/2004 | Park ............... 385/4 |
| 2005/0008290 | A1 | 1/2005 | Miron |
| 2007/0251916 | A1 * | 11/2007 | Akahane et al. ............... 216/27 |
| 2009/0168025 | A1 | 7/2009 | Domm |
| 2010/0053476 | A1 | 3/2010 | Maxson |
| 2010/0053729 | A1 * | 3/2010 | Tilleman et al. ............... 359/298 |
| 2010/0079848 | A1 * | 4/2010 | Grasser et al. ............... 359/291 |
| 2010/0118397 | A1 | 5/2010 | Powell |
| 2010/0171927 | A1 * | 7/2010 | Kitano et al. ............... 353/20 |
| 2010/0253769 | A1 * | 10/2010 | Coppeta et al. ............... 348/58 |
| 2010/0296064 | A1 | 11/2010 | Silverstein et al. |
| 2010/0296065 | A1 | 11/2010 | Silverstein et al. |
| 2011/0013149 | A1 * | 1/2011 | Utsunomiya ............... 353/38 |
| 2011/0102748 | A1 | 5/2011 | Shevlin |

OTHER PUBLICATIONS

Rajeev Ramanath, "Minimizing observer metamerism in display systems," Color Research and Application, vol. 34, No. 5, pp. 367-368 (2009).

B. Oicherman et al., "Effect of observer metamerism on colour matching of display and surface colours," Color Res. & Appl., 33(5): pp. 346-359 (2008).

Sarkar et al., "A color matching experiment using two displays: design considerations and pilot test results," Final Program and Proceedings, CGIV 2010 conference, Joensuu, Finland (2010).

Jacques Gollier, "Speckle Measurement Procedure," Conference Projector Summit 2010, Las Vegas, NV, May 7, 2010.

Joseph Goodman, "Speckle Phenomena in Optics," Ch. 7 (Roberts and Company 2006).

R.W.G. Hunt, "Measuring Colour," Fountain Press (1996).

Fred Billmeyer, et al., "Principle of Color Technology," John Wiley and Sons (1981).

Bahaa E.A. Saleh, et al., "Fundamentals of Photonic" Wiley & Sons (1991).

* cited by examiner

US 9,158,063 B2

APPARATUS FOR DESPECKLING LASER SYSTEMS AND METHODS THEREOF

CROSS-REFERENCE TO RELATED APPLICATIONS

This application is a non-provisional conversion of, and thus claims priority to, U.S. Provisional Patent Application No. 61/505,217, entitled "Monitoring and control of laser module for projectors," filed Jul. 7, 2011, and U.S. Provisional Patent Application No. 61/505,220, entitled "High power frequency diverse lasers for projection display," filed Jul. 7, 2011, and U.S. Provisional Patent Application No. 61/505,211, entitled "Method and apparatus for speckle reduction," filed Jul. 7, 2011, and U.S. Provisional Patent Application No. 61/505,455, entitled "De-speckling fiber," filed Jul. 7, 2011 all of which are incorporated herein by reference in its entirety.

TECHNICAL FIELD

Generally, this disclosure generally relates to lasers, and more particularly relates to the laser systems.

BACKGROUND

Light Amplification by Stimulated Emission of Radiation, also known as laser, refers to the emission of light from excited atoms. Laser light sources are narrow-band light sources operable to provide colored light. Laser light sources may be desirable because of their long lives, high intensity, and superior collimation. Lasers have a variety of applications, such as laser engraving, laser bonding, laser pointers, photolithography, lighting, LIDAR, surveying, barcode reading, and laser surgery.

BRIEF SUMMARY

An exemplary embodiment is directed to a laser system comprising a laser light source operable to output illuminating light, a display device operable to receive the illuminating light, and an optical fiber operable directed the illuminating light from the laser light source to the display device. The disclosed laser system also includes a vibration device attached to the optical fiber, wherein the vibration device is operable to vibrate at a frequency greater than a threshold frequency so as to reduce speckle.

Another exemplary embodiment is directed to a method of providing illumination. The exemplary method includes outputting illuminating light from a laser light source, directing the illuminating light through an optical fiber to a display device, and vibrating the optical fiber at a frequency greater than a threshold frequency so as to reduce speckle.

Another exemplary embodiment is directed to a laser system comprising a laser light source operable to output illuminating light, a display device operable to receive the illuminating light, and an optical fiber operable to direct the illuminating light from the laser light source to the display device. The optical fiber has a core extending along a central longitudinal axis and a cladding layer covering the core, the core having a refractive index profile defined from the central longitudinal axis to a longitudinal edge, the refractive index profile comprising a first refractive index at the longitudinal edge that is greater than a second refractive index at the longitudinal axis.

DETAILED DESCRIPTION

Figure 1:
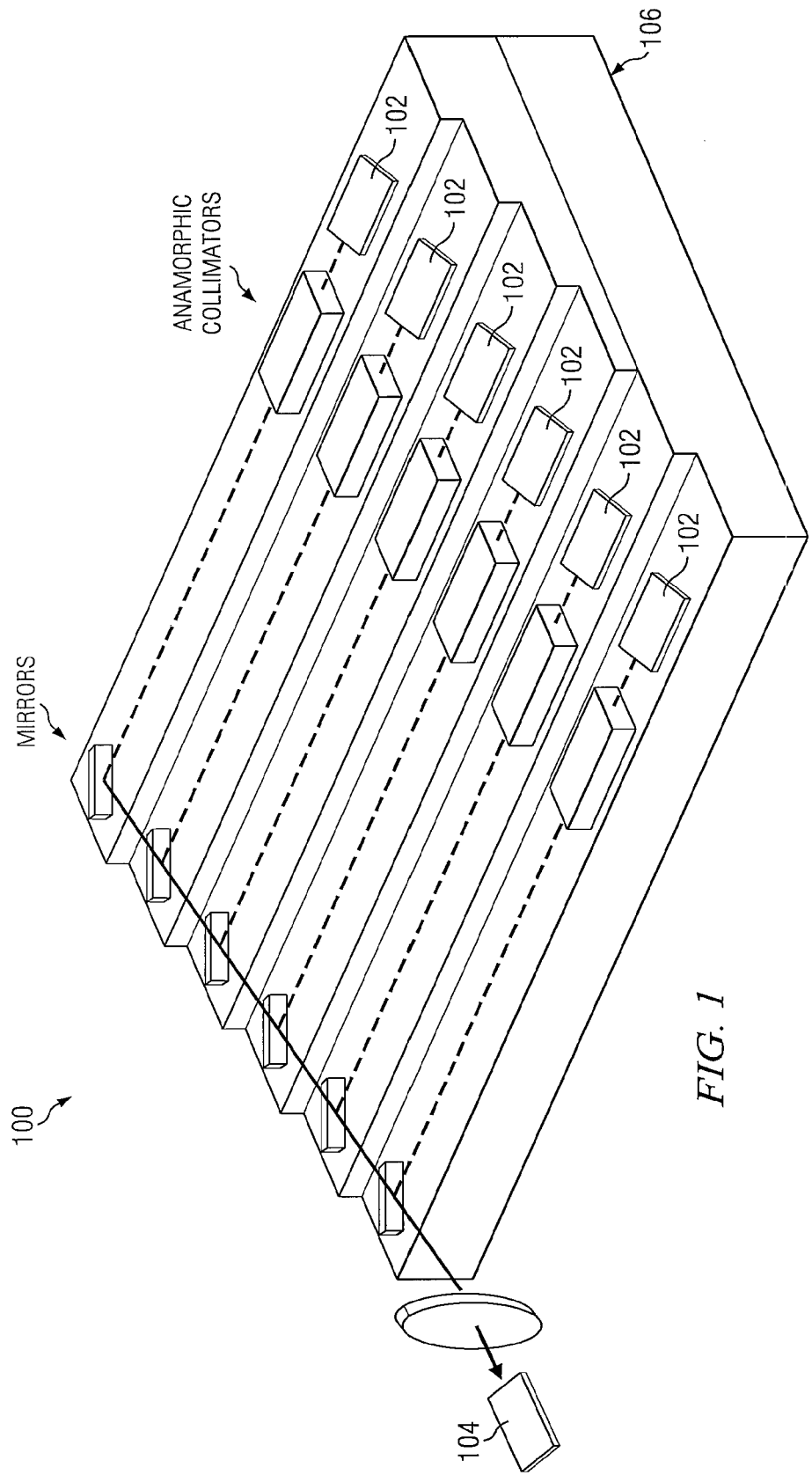
FIG. 1 is a schematic diagram showing an exemplary laser sub-module, in accordance with the present disclosure.

As disclosed in U.S. Pat. No. RE42,251, which is incorporated by reference herein, business projectors may use only 3-6 W to power each color (red, green, and blue) because the screen size is fairly small (5-10 feet). Cinema projectors, on the other hand, may provide 20-500 W to power each color depending on screen size (20-80+ feet) to provide sufficient light to overcome systems losses incurred, such as the losses involved in 3D cinematic display systems. 3D movies may use more power than 2D movies, and thus, there is a need for 30-500+W to power each color for digital projection displays.

With this the large power requirement, there is a need for projector systems with alternative light sources with higher output performance for cinema projection display. Lasers are one light source technology to consider. The use of coherent or partially coherent light sources can have advantages over standard incoherent sources (lamps) in projection display. In some embodiments, lasers may allow for higher brightness, better efficiency, require less maintenance, and have larger color gamuts. A general review of lasers for all display applications is provided in Kishore V. Chellappan et al., Laser-based displays: a review, Applied Optics, Volume 49, Number 25, pp F79-F98 (2010), which is hereby incorporated by reference. According to an embodiment, exemplary efficient lasers include direct emitting lasers such as semiconductor (edge emitting) diode lasers, and vertical cavity surface emitting lasers (VCSELs). In an embodiment, these may have anywhere from 5-70% efficiency in converting electrical power to light power. They also can be very reliable lasting for tens of thousands of hours versus 2000 to 5000 hours for most projector lamps.

In an embodiment, suitable laser diodes may include single individual emitters or bars (stack of edge emitters) and may have red, green and blue wavelengths. Red may be defined as light having a wavelength between 615-670 nm; green may be defined as light having a wavelength between 515-550 nm, and blue may be defined as light having a wavelength between 445-475 nm. These colors roughly allow for all the colors needed to cover the Digital Cinema requirements. It should be appreciated that other colors, or additional colors may be used (e.g., yellow) to increase the color gamut.

According to an aspect of the present disclosure, improved brightness and other performance factors may be achieved by using digital projectors and displays with laser modules. High power lasers (e.g., >20 W per color) with small etendue may be available and useful for cinema projection applications, but using conventional laser devices may cause performance degradation of these systems due to the issues of viewer metamerism and speckle. In some embodiments, the laser modules of the present disclosure may be controlled and monitored as separate units from the digital projectors to optimize performance and minimize performance degradation. According to another aspect of the present disclosure, desirable performance of laser-based projectors and displays may be achieved using fiber configured to reduce speckle.

Metamerism refers to different viewers perceiving the same light condition as different colors. This may particularly be an issue for narrow frequency band primary light sources. In an embodiment, by increasing the bandwidth of the three primary colors, the issue of observer metamerism may be reduced. Ideally, the light would be completely white to minimize different viewers interpolating the same lighting as different colors. See, e.g., Rajeev Ramanath, *Minimizing observer metamerism in display systems*, Color Research and Application, Vol. 34, No. 5, pp 367-8 (2009); B. Oicherman et al., *Effect of Observer Metamerism on Colour Matching of Display and Surface Colours*, Color Res. & Appl., 33(5): pp. 346-359 (2008); and Sarkar et al, *A color matching experiment using two displays: design considerations and pilot test results*, Final Program and Proceedings, CGIV 2010 conference, Joensuu, Finland (2010), all of which are herein incorporated by reference.

Speckle may result from interference of the light on the screen or target which causes variations in intensity that can be seen by the observer or instrument and may be an undesirable side effect of using narrow bandwidth sources (e.g., lasers). Speckle may be measured by measuring the contrast of the light intensity. This is defined as the standard deviation over the mean of the intensity as disclosed in Jacques Gollier, *Speckle Measurement Procedure*, Conference Projector Summit 2010, Las Vegas Nev., May 7, 2010, which is herein incorporated by reference. The high frequency intensity variations are undesirable for display or imaging applications. The speckle pattern may create noticeable undesirable intensity variations across the display. Speckle may be reduced using various approaches.

An approach to reduce speckle involves using moving one or more diffusers to achieve changes to the phase locally to temporal average out some of the speckle over the observer's/detector's integration period. The diffusers can also be vibrating with an amplitude that is large enough to cover several diffractive elements to achieve some averaging as well. See The above discussed exemplary approaches for reducing speckle are disclosed in U.S. Pat. Nos. 5,313,479, 4,035,068, 7,585,078, and 7,922,333, all of which are herein incorporated by reference.

Another approach to reduce speckle involves using moving mirrors or phase modulators to achieve the temporal averaging. Generally, a disadvantage of these techniques includes the use of expensive moving parts or phase modulators. The above discussed exemplary approaches for reducing speckle are disclosed in U.S. Pub. App. Nos. 2011/0102748 and 2010/0053476, and U.S. Pat. Nos. 4,155,630 and 7,489,714, all of which are herein incorporated by reference.

Another approach to reduce speckle involves using a large core, long, high numerical aperture (NA) multimode fiber to "decoher" a laser beam. As disclosed in U.S. Pub. App. No. 2009/0168025, which is herein incorporated by reference, a 12 mm diameter core fiber with an NA of 0.65 may be used. This large fiber may provide some reduction in speckle but deleteriously destroys the brightness of the system since the etendue is so very large. Similarly, U.S. Pub. App. No. 2010/0079848 disclosed a very long multimode fiber that can have some benefits but reduces the power with absorption. Other approaches are described in Joseph Goodman, *Speckle Phenomena in Optics*, Ch. 7 (Roberts and Company 2006). All references cited in this paragraph are herein incorporated by reference.

Another approach involves dividing the beam up into parts and then forcing each part to have different path lengths or changes of polarization before recombining the beams. Examples of using fiber bundles or splitter/combiners or lenslet arrays include: U.S. Pub. App. Nos. 2005/0008290, 2010/0296065, 2010/0296064, and U.S. Pat. Nos. 4,360,372, 6,594,090, 6,895,149, 7,379,651, 7,527,384, 7,719,738. An exemplary approach uses a lenslet integrator in conjunction with a moving diffuser to reduce speckle. Another exemplary approach uses a moving lenslet array instead of a diffuser to reduce speckle. These teachings use expensive fiber bundles or lens arrays or many fiber coupler/splitters to achieve some reduction in speckle. All references cited in this paragraph are herein incorporated by reference.

Another approach utilizes sources with larger spectral bandwidths. This can be achieved by chirping the drive current, using several lasers of different wavelengths, or other means. For instance, in a projection display, a bandwidth of 4-15 nm can improve resulting image quality. Examples are disclosed in U.S. Pat. Nos. 6,445,487 and 7,620,091, and Joseph Goodman, *Speckle Phenomena in Optics* (Roberts and Company 2006). All references cited in this paragraph are herein incorporated by reference.

Moving the screen is also a possible approach to address the undesirable problem of speckle. Chapter six of Joseph Goodman's Speckle Phenomena in Optics disclosed a calculated linear shift rate of the screen in x or y or screen rotation (these motions are the plane of the screen with is roughly normal to the projection) in order to average out some of the speckle during the observer's/detector's time integration period. By moving the screen, the light hits different parts of the screen which then changes the speckle pattern. If this is done more quickly than the detector's integration period (for example, the eye is roughly 20 Hz) then the detector will see an average of several speckle patterns, which results in a lower speckle contrast. U.S. Pat. No. 5,272,473 disclosed the use of a transducer attached directly to the screen to mechanically generate surface acoustic waves to minimize speckle is taught. U.S. Pat. No. 6,122,023 taught the use of a highly scattering liquid crystal as a screen and then electrically changing the liquid crystal states to alleviate speckle. Other uses of scattering liquids or diffuser cells to improve speckle have be described in U.S. Pat. Nos. 6,844,970, 7,199,933, 7,244,028, 7,342,719, and U.S. Pub. App. No. 2010/0118397. All references cited in this paragraph are herein incorporated by reference.

Despite the issues of speckle and metamerism, lasers may have the advantage of being bright as discussed above. They can have a lot of energy and a small etendue, which may be determined by multiplying size of the beam by the solid angle of the system's entrance pupil. The small etendue of lasers may allow lasers to be efficiently used as light sources for a digital projection display in embodiment in which the small etendue of lasers is a good match for the small etendue of spatial light modulators used in the projectors. If the source has a larger etendue than the projector, not all the light will make it through the projector.

VCSEL are currently available in red or infrared (IR) as arrays of emitters. However, the single emitters are currently under one watt per device. Thus, an architecture using a plurality of laser devices may be used to reach the powers required by projection display, particularly for cinema applications. A potential architecture increasing the power using VCSEL arrays or laser diodes could involve the use of sub-modules.

FIG. 1 shows an exemplary sub-module 100 comprising a plurality of laser emitters 102 being combined in fiber 104. The laser emitters 102 may be disposed on sub-mount 106, and the number of laser emitters 102 may vary. In an exemplary embodiment, 3 to 12 laser emitters 102 are included in the sub-module 100. By combining them before putting into the fiber 104, better brightness can be achieved. An embodiment of sub-module 100 may be configured as a bar with a plurality of laser emitters 102 that is fiber coupled out or is collimated and has a free space output of the beam. In such an embodiment, the laser emitters 102 may be physically stacked in one direction in close proximity. In an embodiment, 3 to 200 laser emitters may be included in the sub-module 100 having a bar configuration.

For VCSEL, a sub-module 100 may be a single array that has either fiber or free space beam out. The sub-module 100 may have a power of 1 to 2 W to up to about 40 W. An improved lifetime may be achieved by running the individual laser emitters 102 with lower power than the rated power. This may be referred to as derating the laser emitters 102.

Figure 2:
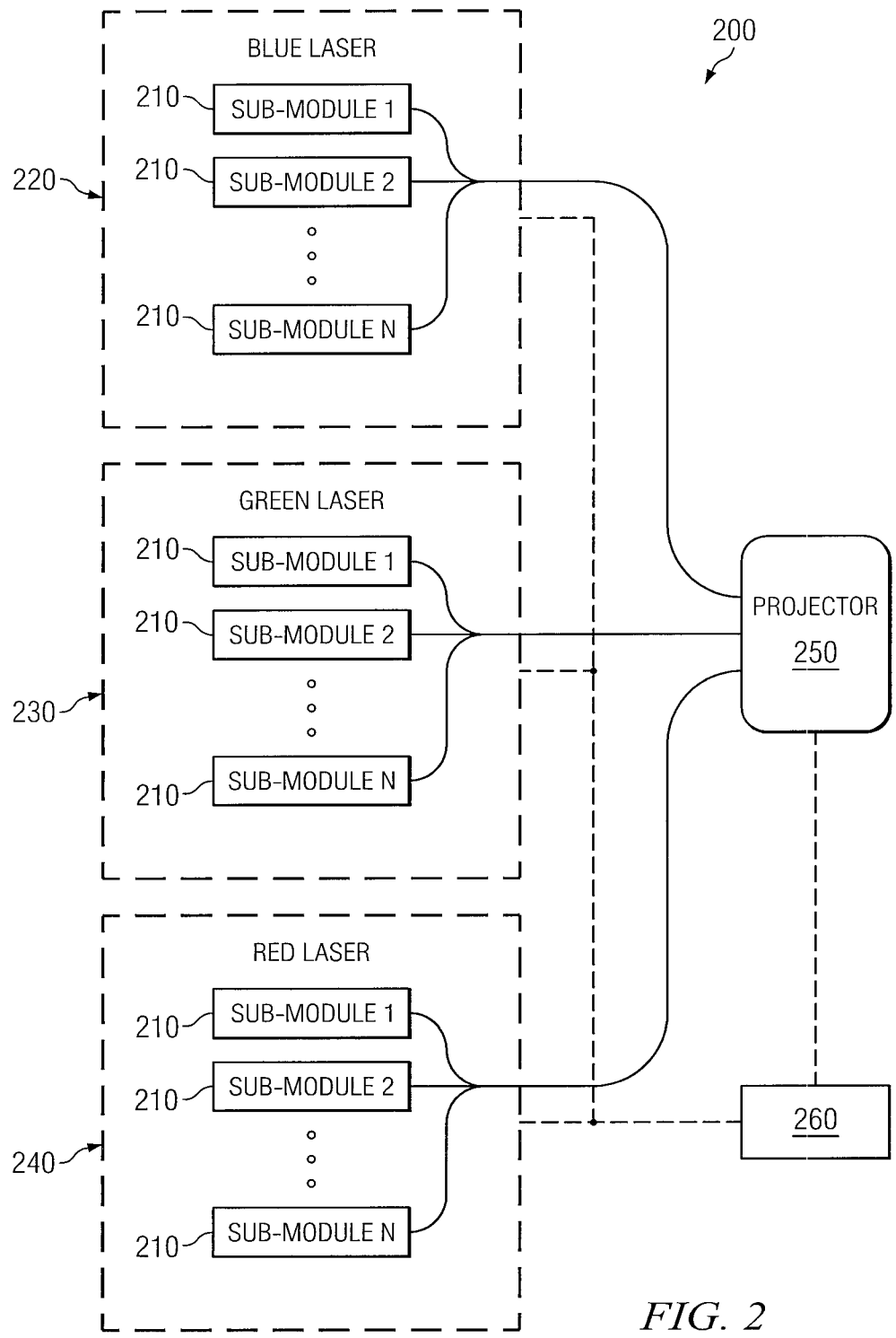
FIG. 2 is a schematic diagram showing an exemplary architecture of a laser system, in accordance with the present disclosure.

FIG. 2 is a schematic diagram showing an exemplary laser system 200 comprising high output laser modules 220, 230, and 240 for different colors. In an embodiment each of the laser modules 220, 230, and 240 includes a plurality of sub-modules 210. The number of sub-modules 210 in the laser modules 220, 230, and 240 may vary. In an embodiment, the number of sub-modules 210 may range between 2 to 50, with each sub-module 210 being similar to the sub-module 100 and comprising a plurality of single laser emitters (not shown). The single emitters may be laser diodes such as edge emitters, VCSEL arrays, diode pumped solid state lasers that are doubled, doubled fiber lasers, and/or directly doubled VCSEL arrays for each color laser module 220, 230, and 240. The sub-modules 210 can be combined by free space, waveguides, or by fiber combiners to make one high power laser (e.g., >20 W) for a color. More specifically, the light from each sub-module 210 may be combined together by free space combination with mirrors or polarizing beam splitters, or combined with fiber combiners if coupled to fibers. This can be done for all three colors using different emitters, such as red, green, or blue. The number of laser emitters in each sub-module 210 may vary. In an embodiment, number of laser emitters in each sub-module 210 may range from 2 to 1000. To compensate for combining losses, the sub-modules 210 may have extra laser emitters to provide extra power for dealing with these losses as well as to improve the lifetime of the laser by allowing the individual emitters to be derated.

Light from the laser modules 220, 230, and 240 may be input into a projector 250 to provide illumination in the same manner that a lamp would. The projector 250 may include homogenization optics and use any techniques disclosed herein or known in the art for reducing speckle. The sub-modules 210 of the laser modules 220, 230, and 240 may be in communication with a controller module 260 that is operable to control, monitor, or report on the lasers status of the laser system 200. In an embodiment, the controller module 260 is operable to automatically control the parameters of the system 200 within predetermined ranges as well as report status and alerts via a network (not shown).

It is to be appreciated that by using sub-modules 210, the overall laser module 220, 230, or 240 can achieve higher power (e.g., >20 W) per color and better, cheaper and larger wavelength diversity. Each sub-module 210 may have its own drive electronics (not shown) and cooling system (not shown) to allow control over wavelength diversity, power, and temperature control over an entire sub-module 210 or within a sub-module 210. The laser modules 220, 230, and 240 may be controlled by separate controllers in the controller module 260. The controller may an electrical interface such as RS232, USB, RS485, Fiber Channel, SCSI, etc, and may use a communication protocol to pass commands to each laser unit.

Figure 3:
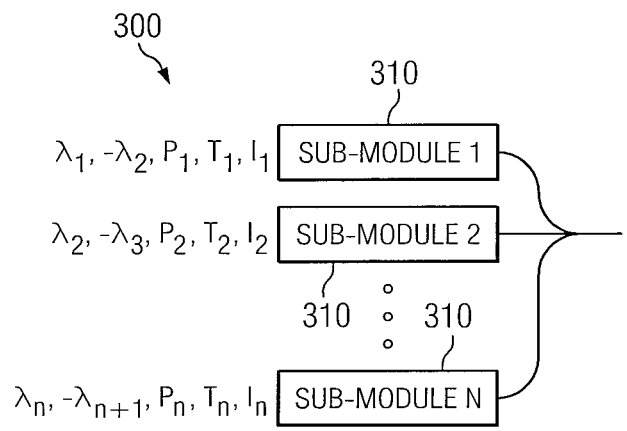
FIG. 3 is a schematic diagram showing an exemplary architecture of laser module having sub-modules for a color range, in accordance with the present disclosure.

FIG. 3 is a schematic diagram showing an exemplary architecture 300 of laser sub-modules 310 for a color range, such as red, green, or blue. The architecture 300 may be implemented for any of the laser modules 220, 230, and 240 shown in FIG. 2. In an embodiment, overall color balance may be maintained to get to the correct Digital Cinema Initiative (DCI) white point by adjusting the power per color and/or adjusting the color by changing the temperature of the lasers emitters of sub-modules 310. The overall architecture allows for higher power and greater control of wavelength, power spectral density by allowing individual adjustment temperature and current of the sub-modules 310. As shown by FIG. 3, each sub-module 310 inside can have many controls and be designed to have different wavelengths to help minimize speckle and observer metamerism.

Figure 4:
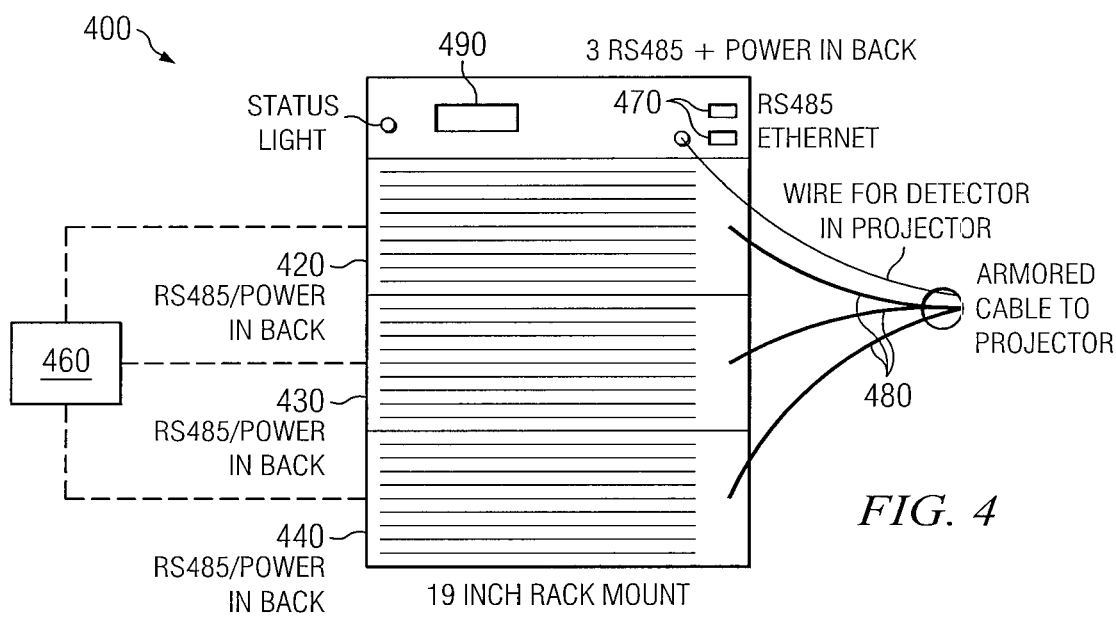
FIG. 4 is a schematic diagram showing an exemplary embodiment of a laser system, in accordance with the present disclosure.

FIG. 4 is a schematic diagram showing an exemplary embodiment of a laser system 400 with laser monitoring and control features. In this exemplary embodiment, a controller module 460 may be mounted at the top of the lasers 420, 430, and 440, and may have communication buses 470, such as Ethernet and RS485. Each of the lasers 420, 430, and 440 may include a plurality of sub-modules similar to sub-modules 210 and 310 shown in FIGS. 2 and 3. In an embodiment, the lasers 420, 430, and 440 and controller module 460 may be disposed in a standard 19 inch rack mount or another non standard size. The optical interface with a projector (not shown) may comprise optical fiber 480.

In an embodiment, one of more optical fibers 480 per color may be used or all three colors could be put into on single fiber 480. The fiber 480 may be multimode, single mode, and/or polarization preserving. Photonic crystal fibers can be polarization maintaining single mode and yet still handle the high power with their expanded mode area. By using polarization maintaining fiber polarized light could be gotten to the projector which could be useful in making simpler and cheaper projectors for 2D and 3D applications.

In addition, an electrical cable or wire (not shown) may be run with the optical fibers 480 to the projector. In an embodiment, the cable may be used to inform the lasers 420, 430, and 440 of the status of the projector, such as on/off/off, or control the lasers 420, 430, and 440, such as turn off/on/idle, change power, etc. The cable or wire may also be used to verify that the light is getting to the projector by having an optical power sensor not shown) installed in the projector laser interface at time of installation. This interface with the projector could be a custom interface with a single or few wires or use a standard interface such as RS485, USB, Ethernet, GPIB, RS232 or others or a combination of standard interface and single/couple of wires for power or other things that might be desired. Power may be supplied by the controller module 460 to power motors, or vibration devices, which will be discussed in greater details in another portion of the present disclosure.

Interface with user and installer or maintenance provider can include several interfaces, including a front panel that might include indicators or displays 490 for various status, such as On/Off/Idle Status, interrupts okay/bad, interrupt reset, power level per laser, hours run, on/off switch, need maintenance of something wrong indicator, etc. In addition, the communications interface 470, such as an Ethernet or IEEE 802.11x, may allow the user a certain level of access to the laser module functions while denying them access to others (e.g., setting power). In an embodiment, the standard interface, such as an Ethernet, may allow the lasers 420, 430, and 440 to be placed on the internet or a network. This would allow the laser installer or maintenance provider to have remote and local access to all the control parameters over the network. A typical example of maintenance and installation use of this interface would be for calibration of the lasers 420, 430, and 440—setting power per color to set white point. When a laser 420, 430, or 440 is installed to a projector in the field (e.g., in a theater), a technical person may measure the power and the white color balance out of the projector and then adjust the lasers power output and/or wavelength to set the white balance and overall power levels to the desired points. Ethernet interface with access to all commands may be protected by various security mechanisms known in the art. In an embodiment, the interface may be encrypted and/or require an authorization process required for access the whole range or subset of the commands. Network connection to the controller module 460 may be through wired or wireless connectivity such as Wi-Fi or other wireless standards.

Possible commands and queries and actions allowed by the controller module 460 may include:
Interlocks/Interrupts that may be substantially constantly monitored
  Cooling failure of laser (e.g., fans, TEC, temperature): orderly shutdown
  Laser module container opened during operation—orderly shutdown
  Laser module internal enclosure breach—emergency shutdown; in an embodiment, laser may be cut off such that the laser light is reduced to an eye safe level in less than 100 milliseconds.
  Projector interface umbilical conduit damage—Orderly shutdown
  Projector enclosure breach—Orderly shutdown
Monitor current and temperature at set point—increase of greater than X indicates need for replacement in next week/month etc
Monitor light power that gets to projector
Reset interrupts
power on, idle, off status
set power on/off/idle
power of each laser sub-module
current of each laser sub-module
temperature of each laser sub-module
laser module environmental (box) temperature
total current of laser module
total power of laser module
Laser module ID
Laser rack installation date from controller
Last date controller was calibrated
set power of each laser sub-module
set current of each laser sub-module
set temperature of each laser sub-module
set power of laser module
set laser module to constant power mode at set point
set current of laser module
set temperature of laser module
set allowable range of temperatures
Number of "ON" hours for each laser module
Calibration setting of power, temperature points
Signal for required maintenance immediately
Signal for anticipated maintenance
Separate calibration and power levels for 2D and 3D movies The controller module 460 may be operable to monitor the laser sub-modules as well as the lasers 420, 430, and 440 as a whole to ensure some of the above parameters are within the require range for operation. Exemplary parameters to be monitored may include various combinations of power, temperature, current, safety conditions (interlocks), fan speed, and wavelength of the lasers. For example, in an embodiment, the controller module 460 may substantially automatically track power per color and may track wavelength as well to maintain the correct white point and color calibration as the lasers 420, 430, and 440 age or the environment temperature changes. To provide feedback for control, these sub-modules may have power, temperature, wavelength (spectrum analyzer), airflow, and current sensors. In an embodiment, for most lasers emitters, such as semiconductor diodes, if the current required to keep the optical power at a constant level increases beyond a certain level (e.g., increases by 5-40%), then the lasers may be anticipated to be at or near the end of life.

It is to be appreciated that the controller module 460 may be configured to operate in a feedback mode. In an embodiment, the controller module 460 may be operable to adjust the operating parameters of the laser sub-modules and/or the lasers 420, 430, and 440 as a whole based on the parameters being monitored. For example, as parts of the sub-modules die or degrade or even whole sub-modules die or degrade, the output power may still be maintained by increasing the current to the other elements or sub-modules in the laser system 400. The controller module 460 may be operable to keep a record of a number of the laser/system parameters so that problems could be identified remotely or changes in parameters, such as, current, on hours, interrupts, failures, temperature changes, can be used by the controller module 460 to maintain performance and make a record of problems. This information as well as status can be made available to the user/maintenance provider. In an embodiment, by looking at the current required, the controller module 460 may be operable to predict the potential failure or the need for maintenance of these items.

By allowing access of the controller module 460 over the internet or other network, the controller module 460 may be configured to allow reporting of potential issues or problem to the user and/or the maintenance provider to minimize down time of the laser system 400. This reporting can be done over the network as email, text message, phone calls, or alerts in a monitoring program that resides remotely. In embodiment, the controller module 460 may be operable to report when the current at constant power has increased and crossed a predetermined level and alert the user and/or maintenance provider of a future failure so that the laser or sub-module can be replaced before failure occurs. The number of "on" hours can also be used as a predictor of failure and used to alert people to potential problems. In an embodiment, the controller module 460 may be operable to provide periodic automatic reports on status and function of the lasers (e.g., power, temperature, current, fans, interrupts status, etc.) and projector interface information (e.g., light power levels, motor status, interrupt status, etc.) to users and/or maintenance providers. Authorized users/providers can also request or poll the status of the various parameters of the lasers and their sub-modules remotely or while working on/calibrating the lasers 420, 430, 440 and the projector. It would also be possible to run commands to fix problems or look at the data that the controller module 460 keeps to identify potential problems remotely. An example may be to reset the interrupts and restart the laser.

2D and 3D movies have significantly different light efficiency. For example, the standard 2D movie should be shown at 14 ftL. However, in order to have a 3D movie shown at 14 ftL, the brightness for a 2D movie shown with those setting would be approximately 27 ftL—generally too bright. In addition, the color balance of the projection system may change with the polarization switching and glasses used for 3D. Thus, in an embodiment, the controller module 460 may have two calibrations for power and color balance for both 2D and 3D stored. A button or Ethernet control could be used to switch the laser module between 2D movie mode and 3D movie mode.

It is to be appreciated that the freedom to individually configure and control the plurality of sub-modules in the laser systems 200, 300, and 400 allows for various techniques to increase spectral diversity in the laser systems 200, 300, and 400 and reduce speckle. Provided below are some exemplary embodiments of the techniques for reducing speckle and metamerism.

Example 1

In an embodiment, individual laser emitters 102 may be selected by wavelength to fill sub-modules 210, 310 with certain range of wavelengths. Laser diodes naturally have a spread of wavelength due to manufacturing variations. This spread in wavelength of manufactured devices may follow a Gaussian distribution. By picking amongst this distribution, the laser emitters 102 may be categorized into bins depending on wavelength. In addition, additional and different center wavelength devices may be designed to increase the wavelength spread that can be selected from. In an exemplary embodiment, the wavelength distribution of these bins may be 1 to 3 nm wide. A bin may be included in a plurality of sub-modules 210, 310 or each sub-module 210, 310 may be made from a single wavelength bin. Since the overall system 200, 400 may use many more emitters 102 than what is in a single sub-module 210, 310, the bandwidth is statistically very likely to be covered adequately and it is acceptable to not know the exact wavelength. Thus, in an embodiment, an approximate measurement of the lasers' wavelength may acceptable, since binning the emitters/arrays based on a couple of nm is acceptable. A wavelength spread of laser diodes and VCSEL arrays may be around 1 to 10 nm. However, for both VCSELs and laser diodes, by using larger than 2 inch wafers and decreasing the processing control, larger variations in wavelength are possible—10 to 15 nm. By sorting the diodes/VCSEL arrays into wavelength bins, more emitters 102 at the edges of the wavelength distribution may be chosen to increase the wavelength spread, which may substantially guarantee a certain spread, and to increase the power spectral density of the combination laser and the power uniformity across the wavelength range. In addition, the sub-modules 210, 310 with different wavelengths can be driven at higher or lower powers to make a more uniform power spectral density. Using VCSEL arrays may be advantageous because as their individual arrays have typical bandwidths of 0.5 to 4 nm due to thermal disparity across the array. Thus VCSEL sub-modules 210, 310 may fill a wavelength bandwidth substantially evenly. Binning reduces the cost of measuring and separating the diodes rather than arranging them distinctly by wavelength as proposed by U.S. Pat. No. 6,975, 294. By using multiple sub-modules 210, 310, the number of emitters is much larger, their wavelengths may be changed by setting the temperature of the sub-modules 210, 310, and the power density spectrum can be improved by both wavelength selection and temperature and power control, allowing for a certain wavelength spread and power spectral density.

Example 2

In an embodiment, the uniformity of the power across the wavelength range may be increased by operating emitters 102 or sub-modules 210, 310 at different powers depending on wavelength. Since the sub-modules 210, 310 may be configured to have their own cooling and drive electronics, the optical power of the sub-modules 210, 310 may be adjusted by controlling the drive current and temperature. Since the sub-modules 210, 310 may have their own wavelength range, the power of across the spectrum can be improved inexpensively. The power of the sub-modules 210, 310 may be set during calibration to make the power spectral density more uniform or shaped as desired (e.g., Gaussian, etc).

Example 3

In an embodiment, the power spectral density uniformity across the wavelength range may be improved by determining the number of emitters 102 in sub-modules 210, 310 depending on the wavelength range of the emitters. The power of a sub-module 210, 310 increases with the number of emitters 102.

Example 4

As discussed above, the sub-modules 210, 310 may be configured to be physical and partially thermally separated and have their own cooling and electronics, and it is thus possible to operate the various sub-modules 210, 310 at distinctly different temperatures. In an embodiment, the temperature influences the power output by the emitter/array 102 and directly determines the wavelength out of the laser device comprising sub-modules 210, 310. The red emitters/arrays 102 have particularly large wavelength dependence on temperature. Because it is possible to increase the temperature range that various different wavelength emitters/arrays 102 operates, the wavelength range of the whole blue, red, or green laser device may be increased over 2D or 1D arrays of single lasers as described in U.S. Pat. No. 6,975,294, and the power spectrum can be better optimized for greater uniformity across the wavelength range.

Example 5

In an embodiment, the wavelength ranges of emitters 102 may also be chosen to statically minimize observer metamerism. Certain wavelengths may have less variation in color perception. More uniform ranges may have fewer variations in color perception. So choosing emitter bandwidths and center frequencies to achieve less metamerism may be done with laser systems 200 and 400. In an embodiment, the sub-modules 210, 310 may be configured to have more bandwidth at certain colors (e.g., blue) to minimize metamerism See, e.g., R. W. G. Hunt, *Measuring Colour*, Fountain Press (1996), and Fred Billmeyer, et al., *Principle of Color Technology*, John Wiley and Sons (1981), which are incorporated by reference herein.

As discussed above, a way of directing the light from the laser to the projector, display, or sample to be probed is to use an optical fiber. In an embodiment, the fibers may be single mode or multimode, which may be cheaper and easier to couple into than a single mode fiber and can support much higher energies. The fiber construction can be standard or some other construction like photonic crystal. The fibers may have core diameters ranging from a couple of microns to about 1.2 mm. The numerical apertures of the fibers may be in the range of 0.1 to 0.8. These are relatively inexpensive and come with a number of standard connection options. While conventional optical fibers may reduce speckle to some extent, they do not reduce the speckle to levels that are acceptable for many applications.

In accordance with the teachings of the present disclosure, it is possible to reduce the level of speckle by vibrating the fiber at frequencies higher than the detector can see. For example, if used in an embodiment for eye frequencies, a vibration frequency faster than a threshold frequency may be used, such as 20 Hz. In an embodiment for more advance display systems, the threshold frequency may be higher, such as 60 Hz or 120 Hz. One or more vibration devices can be used along the length of the fiber to achieve the time averaging caused by the change in path lengths of the modes of the fiber. Vibrating the fiber may create local time-varying mechanical stress in the glass of the fiber, inducing local time-varying changes in the glass index. The vibration may be generated and propagated from any mechanical mechanism such as vibration devices used in cell phones or piezo-electric, etc. Thus they can be simple, inexpensive and reliable. In an embodiment, the vibration devices may be located along straight sections of the fiber or on bends. In addition, the fiber may be looped in circles and a device attached to several loops may be used.

Figure 5:
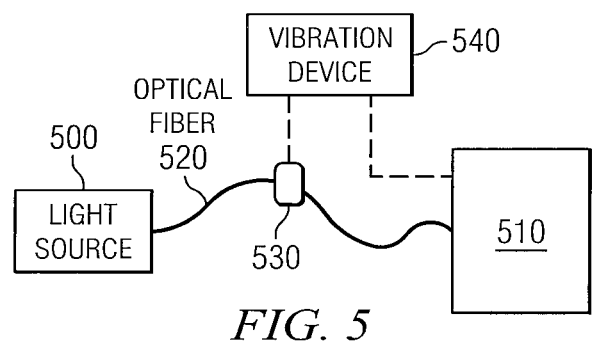
FIG. 5 is a schematic diagram showing an exemplary vibration device operable to reduce speckling, in accordance with the present disclosure.

FIG. 5 is a schematic diagram showing an example of a light source 500 that is connected to a device 510 where the light is needed through an optical fiber 520. For example, the device could be a projector for displaying movies or images or any other display device disclosed herein. At least one vibration device 530 may be attached to the optical fiber 520 by adhesive or mechanical constraints around the standard fiber protective tubing (not shown). The vibration device 530 may remain exposed or may be covered by a protective covering placed over the vibration device 530 or even along the entire fiber 520. In an exemplary embodiment, armored fiber tubing may be used to enclose the vibration device 530 and the fiber 520. In an embodiment, the vibration device 530 may be in communication with a controller 540 that senses speckle and in response, activates the vibration device 530. In another embodiment, the vibration device 530 may be in an always-on state. For the portion of fiber 520 subjected to the mechanical movement from the vibration device 530, the fiber composition may be designed to withstand mechanical impact and wear. Techniques to make the fiber more wear resistant include adding materials to the fiber composition that do not significantly impact the optical transmission performance of the fiber. It to be appreciated that the embodiment shown in FIG. 5 may be implemented with the laser systems 200 and 400 as well as any other suitable systems disclosed herein to reduce speckle.

In a laser-based display system, fibers are a convenient way to combine all of these sources and/or sub-modules together as well as to take the final output and get the light to the projector. The red, green, and blue lasers light could be sent to the projector using one or more fiber per color or even further combined into 1 or 2 fibers that have all three colors.

In accordance with the present disclosure, the index profile of the optical fiber may be designed to despeckle the light without losing too much light (making the fiber too long) or increasing the etendue too much, thereby minimizing the loss of brightness of the source. In an embodiment, the fiber may have the opposite index profile of a conventional gradient index fiber, with larger refractive index further away from the center of the fiber. This may potentially increase the number of modes by increasing the splitting of the light beam, and increases the modal dispersion by de-phasing the split light beams quickly. While such a fiber index profile design contradicts that of a conventional optic fiber and would be ineffective for conventional communications, fibers of such an inverse fiber index profile may be fabricated by the standard MCVD (modified chemical vapor deposition), PECVD (plasma enhanced chemical vapor deposition, or other CVD process that is used to make standard gradient index fiber cores. In addition, in an exemplary embodiment, air holes may be defined in a cladding layer of the fiber to lower its index to increase the index contrast and increase the number of modes that the fiber supports. These two techniques can be combined to make a very effective despeckling fiber.

Figure 6:
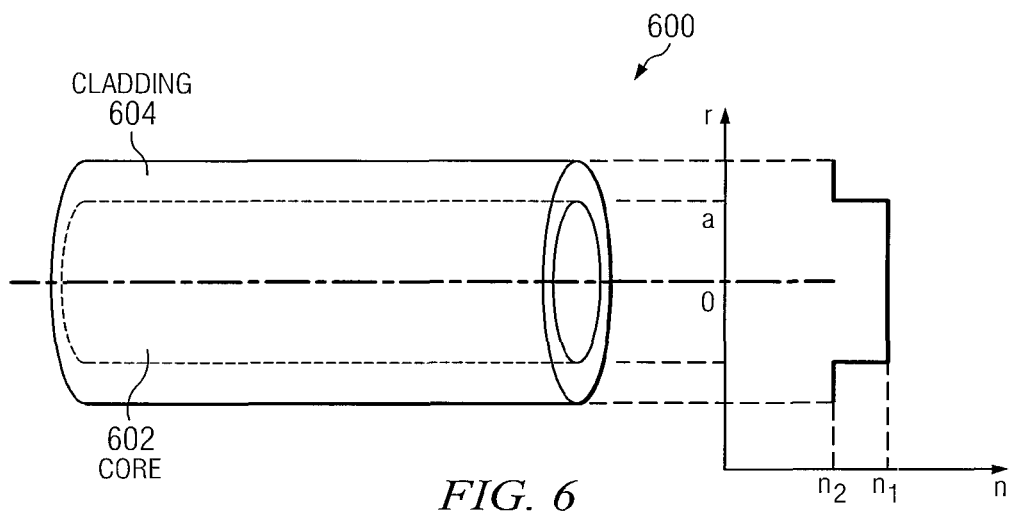
FIG. 6 is a schematic diagram showing a convention step index fiber, in accordance with the present disclosure.

FIG. 6 is a schematic diagram showing the index profile of a conventional fiber 600. The conventional fiber 600 may be a standard multimode fiber or a single mode fiber having step index profile. As illustrated, the core 602 of the fiber 600 has a radius of a and an index of $n_1$. The cladding 604 of the fiber 600 has an index of $n_2$. The index of the core 602 is constant as a function of the radius a as shown in FIG. 2.

Figure 7:
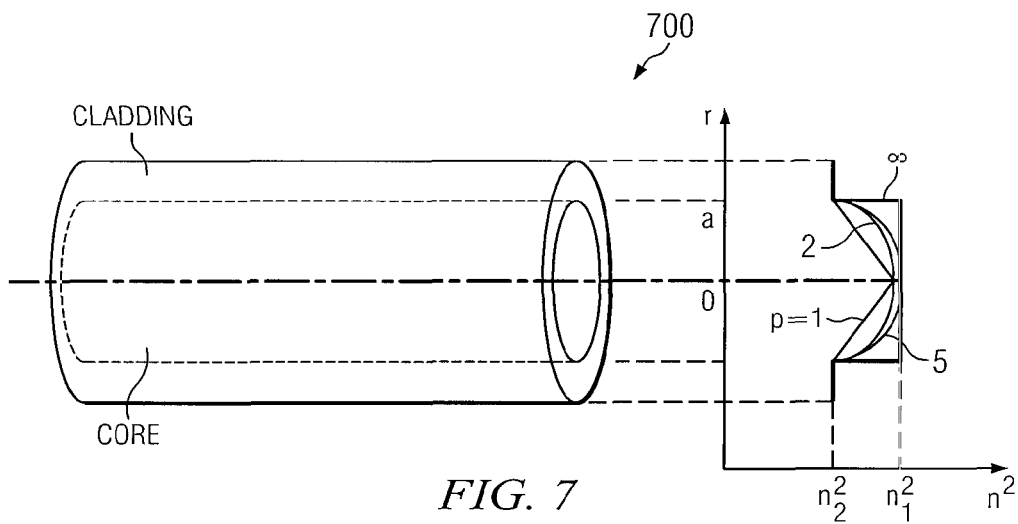
FIG. 7 is a schematic diagram showing a convention gradient index fiber, in accordance with the present disclosure.

FIG. 7 is a schematic diagram showing a conventional gradient index fiber 700. The V parameter for the gradient index fiber 700 is given by equation (1):

$$V=(2\pi a/\lambda_o)n_1\sqrt{(2\Delta)} \quad (1)$$

Where $\lambda_o$ is the wavelength of light, and $\Delta=(n_1-n_2)/n_1$. In the case where there are a lot of modes present (V>>1) then the number of modes in the fiber (M) is approximately given by equation (2):

$$M=(4/\pi^2)V^2 \quad (2)$$

For gradient index fiber the index of the fiber is varied as a function of radius. The center is always higher in the middle of the fiber and lower towards the cladding layer. Typically the index of the core (r<a) is written as equation (3):

$$n^2(r)=n_2^2+2n_1^2(r/a)^p((n_1^2-n_2^2)/n_1^2) \quad (3)$$

where p is the grade profile parameter.

FIG. 7 shows the index profiles for different values of the grade profile parameter for the conventional gradient index fiber 700. See, e.g., Bahaa E. A. Saleh and Malvin Carl Teich, *Fundamentals of Photonic*, p. 288 Wiley & Sons (1991), which is herein incorporated by reference.

The advantages of the gradient index fiber 700 is that the index can be chosen so that there are fewer modes propagating, and because the index is lower towards the cladding 704 (light travels faster there) the profile can be picked (p=2) so that the higher order modes stay nearly in phase with the lower order modes (modes that go closer down the axis). This minimizes modal dispersion and the extent a pulse comes apart into separate modes. Typical comparison of modal dispersion between gradient index fiber 700 and step index fiber 600 is for $\Delta=0.01$, n=1.46 modal dispersion is $n_1\Delta/2c$. For step index fiber with the above parameters, this results in a dispersion of 24 ns/km. In an optimal p=2 gradient index fiber, the dispersion with those parameters is 122 ps/km, which is much better. However, this is undesirable for eliminating speckle.

The number of modes for a gradient index fiber 700 depends on the index profile. They range from slightly more modes to significantly less modes. The expressions for number of mode (M) for p=2 is given is approximately $M=V^2/4$. This is approximately half the number of modes for the step index fiber 600.

According to an exemplary embodiment of the present disclosure, a multimode fiber may be configured to increase both the number of modes and modal dispersion to reduce speckle efficiently. Increasing V will increase the number of modes, and this may be accomplished in a variety of ways. By using a photonic cladding or otherwise reducing the cladding index by doping the cladding glass (e.g., Fluorine), Δ may be increased. In an embodiment, $n_1$ may be increased with some limitations by doping the glass with other materials. In an embodiment, V may be increased by increasing the core size. However, this reduces the brightness of the light coming out. In embodiments for projector applications, a radius a of 30 micron (some number of modes) and less than 800 micron (reduction of brightness) may be preferred, with some fiber of up to 2 mm diameter being used. In an exemplary, a radius a may be optimized to fall between about 100-600 microns to maintain brightness, handle the large power needed, allow for despeckle, and make coupling easy.

Figure 8:
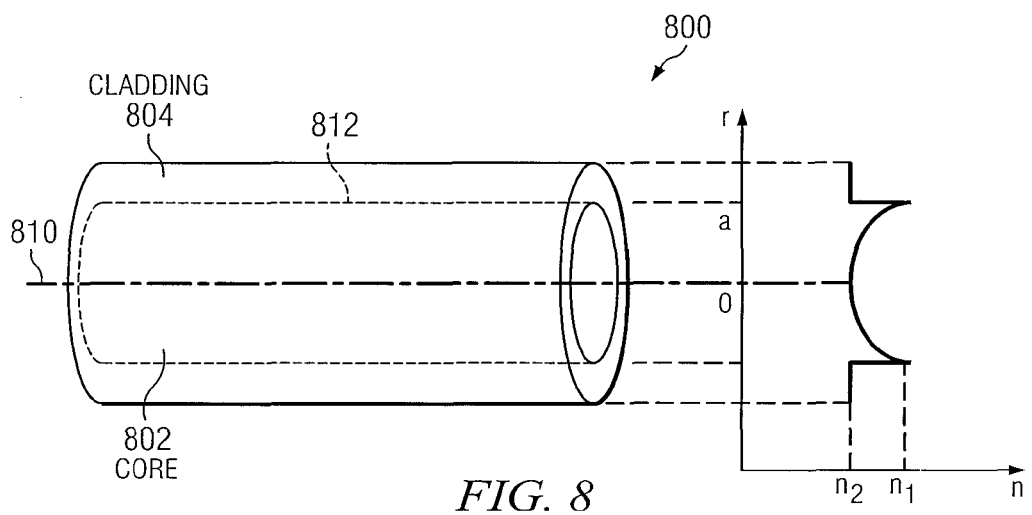
FIG. 8 is a schematic diagram showing a despeckling fiber, in accordance with the present disclosure.

Modal dispersion depends in the index difference (larger is better) and the profile. In an embodiment, by having a profile that contrasts with that of the gradient index fibers 700, the dispersion may be increased. FIG. 8 is a schematic diagram showing an example of such an index profile versus core radius for a despeckling fiber 800. The optical fiber 800 has a core 802 extending along a central longitudinal axis 810 and a cladding layer 804 covering the core 802. The core 802 has a refractive index profile defined from the central longitudinal axis 810 to a longitudinal edge 812. The illustrated refractive index profile include a first refractive index at the longitudinal edge 812 that is greater than a second refractive index at the central longitudinal axis 810. More particularly, the refract index profile comprises a nadir at the central longitudinal axis 810 and a zenith at the longitudinal edge 812. The illustrated index profile may cause the higher order modes to have a much longer optical path than the lower order modes and therefore have large dispersion. Fiber 800 may effectively split the beam into many more sub-beams (modes) and have larger modal dispersion than conventional fibers 600 and 700, which are designed for communications purposes. Having larger index as the radius a increases, speckling of light may be reduced while maintaining the brightness, and shorter fiber may be used to result in less loss of light through absorption. In an embodiment, these fibers 800 may allow a length of 1 m to 30 m be used to achieve 10-50% or larger reduction in speckle contrast in some embodiments. It to be appreciated that the embodiment shown in FIG. 8 may be implemented with the laser systems 200 and 400 as well as any other suitable systems disclosed herein to reduce speckle.

As may be used herein, the terms "substantially" and "approximately" provide an industry-accepted tolerance for its corresponding term and/or relativity between items. Such an industry-accepted tolerance ranges from less than one percent to ten percent and corresponds to, but is not limited to, component values, angles, et cetera. Such relativity between items ranges between less than one percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

What is claimed is:

1. A laser system comprising:
   a laser light source operable to output illuminating light;
   a display device operable to receive the illuminating light;
   an optical fiber operable directed the illuminating light from the laser light source to the display device, wherein the optical fiber has a core extending along a central longitudinal axis and a cladding layer covering the core, the core having a refractive index profile defined from the central longitudinal axis to a longitudinal edge, the refractive index profile comprising a first refractive index at the longitudinal edge that is greater than a second refractive index at the central longitudinal axis; and
   a vibration device attached to the optical fiber, wherein the vibration device is operable to vibrate at a frequency greater than a threshold frequency so as to reduce speckle.

2. The laser system of claim 1, wherein the threshold frequency is about 20 Hz.

3. The laser system of claim 1, wherein the threshold frequency is about 60 Hz.

4. The laser system of claim 1, further comprises at least one additional vibration device attached the optical fiber, the at least one additional vibration device operable to vibrate at a second frequency greater than the threshold frequency.

5. The laser system of claim 1, further comprising a controller operable to receive information about speckle in the illuminating light at the display device and control the vibration device depending on the information.

6. The laser system of claim 1, wherein a portion of the optical fiber is coiled, and the vibration device is attached to the portion.

7. A method of providing illumination, comprising:
   outputting illuminating light from a laser light source;
   directing the illuminating light through an optical fiber to a display device, wherein the optical fiber has a core extending along a central longitudinal axis and a cladding layer covering the core, the core having a refractive index profile defined from the central longitudinal axis to a longitudinal edge, the refractive index profile comprising a first refractive index at the longitudinal edge that is greater than a second refractive index at the central longitudinal axis; and vibrating the optical fiber at a frequency greater than a threshold frequency so as to reduce speckle.

8. The method of claim 7, further comprising:
receiving information about the speckle in the illuminating light; and
adjusting the vibrating of the optical fiber according to the information about the speckle.

9. The method of claim 7, wherein the threshold frequency is about 20 Hz.

10. The method of claim 7, wherein the threshold frequency is about 60 Hz.

11. The method of claim 7, wherein vibrating the optical fiber comprises vibrating the optic fiber at two or more different longitudinal locations along the optic fiber.

12. A laser system comprising:
a laser light source operable to output illuminating light;
a display device operable to receive the illuminating light;
an optical fiber operable to direct the illuminating light from the laser light source to the display device;
wherein the optical fiber has a core extending along a central longitudinal axis and a cladding layer covering the core, the core having a refractive index profile defined from the central longitudinal axis to a longitudinal edge, the refractive index profile comprising a first refractive index at the longitudinal edge that is greater than a second refractive index at the central longitudinal axis.

13. The laser system of claim 12, wherein a radius of the core is defined between the central longitudinal axis to the longitudinal edge, the radius being between 30 to 1000 microns.

14. The laser system of claim 13, wherein the radius is between 100 to 600 microns.

15. The laser system of claim 12, wherein the cladding layer is doped and comprises a reduced cladding refractive index.

16. The laser system of claim 12, wherein the refract index profile comprises a nadir at the central longitudinal axis and a zenith at the longitudinal edge.

17. The laser system of claim 12, wherein the laser light source comprises a plurality of laser modules having different wavelength bands, each laser module comprising a plurality of sub-modules, and the optical fiber is operable to receive light from each sub-modules.

18. The laser system of claim 12, wherein the layer system further comprises a vibration device attached to the optical fiber, wherein the vibration device is operable to vibrate at a frequency greater than a threshold frequency.

19. The laser system of claim 12, wherein the display device comprises a projector.

* * * * *